(12) United States Patent
Roemersperger et al.

(10) Patent No.: US 11,631,910 B2
(45) Date of Patent: Apr. 18, 2023

(54) METHOD FOR MONITORING THE FUNCTIONAL CAPABILITY OF THE COOLING SYSTEM OF A HIGH-VOLTAGE ACCUMULATOR

(71) Applicant: Bayerische Motoren Werke Aktiengesellschaft, Munich (DE)

(72) Inventors: Stefan Roemersperger, Munich (DE); Benno Schweiger, Munich (DE); Othmar Winterling, Eurasburg (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 467 days.

(21) Appl. No.: 16/786,404

(22) Filed: Feb. 10, 2020

(65) Prior Publication Data

US 2020/0176832 A1 Jun. 4, 2020

Related U.S. Application Data

(63) Continuation of application No. PCT/EP2018/071671, filed on Aug. 9, 2018.

(30) Foreign Application Priority Data

Sep. 13, 2017 (DE) ...................... 10 2017 216 161.2

(51) Int. Cl.
*H01M 10/613* (2014.01)
*H01M 10/625* (2014.01)
(Continued)

(52) U.S. Cl.
CPC .......... *H01M 10/613* (2015.04); *G01N 25/00* (2013.01); *G01R 31/36* (2013.01);
(Continued)

(58) Field of Classification Search
CPC ............. H01M 10/486; H01M 10/613; H01M 10/625; H01M 10/633; H01M 10/652
See application file for complete search history.

(56) References Cited

U.S. PATENT DOCUMENTS

| 2007/0120537 A1 | 5/2007 | Yamamoto |
| 2007/0178346 A1 | 8/2007 | Kiya et al. |
(Continued)

FOREIGN PATENT DOCUMENTS

| CN | 1954457 A | 4/2007 |
| CN | 103329340 A | 9/2013 |
(Continued)

OTHER PUBLICATIONS

International Search Report (PCT/ISA/210) issued in PCT Application No. PCT/EP2018/071671 dated Dec. 7, 2018 with English translation (four (4) pages).
(Continued)

*Primary Examiner* — Jonathan G Jelsma
(74) *Attorney, Agent, or Firm* — Crowell & Moring LLP

(57) ABSTRACT

A method monitors the functional capability of the cooling system of an operating high-voltage accumulator for an electric drive unit of a motor vehicle. The method repeatedly measures the temperature of the high-voltage accumulator by use of a temperature sensor mounted on the high-voltage accumulator; checks whether the measured temperature value is above a cooling threshold temperature; determines a profile of the temperature of the high-voltage accumulator using a temporal sequence of the measured temperature values of the high-voltage accumulator which are above the cooling threshold temperature; and diagnoses that the cooling system is operating correctly if the temperature profile does not exceed a predetermined threshold.

10 Claims, 5 Drawing Sheets

(51) Int. Cl.
    *H01M 10/633*     (2014.01)
    *H01M 10/48*     (2006.01)
    *G01N 25/00*     (2006.01)
    *G01R 31/36*     (2020.01)

(52) U.S. Cl.
    CPC ....... *H01M 10/486* (2013.01); *H01M 10/625* (2015.04); *H01M 10/633* (2015.04); *H01M 2220/20* (2013.01)

(56) References Cited

U.S. PATENT DOCUMENTS

| | | | |
|---|---|---|---|
| 2014/0012445 A1* | 1/2014 | Fleckenstein | H01M 10/613 |
| | | | 701/22 |
| 2015/0160077 A1 | 6/2015 | Min | |
| 2016/0104920 A1* | 4/2016 | Eifert | H02J 7/007194 |
| | | | 320/153 |
| 2016/0117906 A1 | 4/2016 | Eifert et al. | |
| 2016/0204478 A1* | 7/2016 | Iguchi | H01M 50/20 |
| | | | 429/62 |
| 2016/0315363 A1 | 10/2016 | Esteghlal | |

FOREIGN PATENT DOCUMENTS

| | | |
|---|---|---|
| CN | 105830275 A | 8/2016 |
| DE | 10 2013 226 145 A1 | 6/2015 |
| EP | 1 786 058 A2 | 5/2007 |
| EP | 1 906 483 A1 | 4/2008 |
| EP | 2 383 832 A2 | 11/2011 |
| WO | WO 2012/079983 A2 | 6/2012 |
| WO | WO 2015/090915 A1 | 6/2015 |

OTHER PUBLICATIONS

German-language Written Opinion (PCT/ISA/237) issued in PCT Application No. PCT/EP2018/071671 dated Dec. 7, 2018 (four (4) pages).

German-language Search Report issued in counterpart German Application No. 102017216161.2 dated May 4, 2018 with partial English translation (12 pages).

German-language Office Action issued in counterpart German Application No. 102017216161.2 dated May 4, 2018 (five (5) pages).

Chinese-language Office Action issued in Chinese Application No. 201880046828.7 dated Jul. 27, 2022 with English translation (19 pages).

* cited by examiner

METHOD FOR MONITORING THE FUNCTIONAL CAPABILITY OF THE COOLING SYSTEM OF A HIGH-VOLTAGE ACCUMULATOR

CROSS REFERENCE TO RELATED APPLICATIONS

This application is a continuation of PCT International Application No. PCT/EP2018/071671, filed Aug. 9, 2018, which claims priority under 35 U.S.C. § 119 from German Patent Application No. 10 2017 216 161.2, filed Sep. 13, 2017, the entire disclosures of which are herein expressly incorporated by reference.

BACKGROUND AND SUMMARY OF THE INVENTION

The present invention relates to a method for monitoring the functional capability of the cooling system of a high-voltage accumulator which is in operation, a corresponding computer program product, a monitoring device which is suitable for this purpose, and a motor vehicle which is equipped with said high-voltage accumulator.

On account of the high energy and power density, high-voltage accumulators, as are used in electric and hybrid vehicles for example, usually have to be actively cooled in order to ensure the operational reliability and the performance. Different cooling techniques, such as air cooling, liquid cooling or direct refrigerant cooling for example, can be used in the process. Each of these cooling methods has different thermodynamic properties.

In some markets, it is necessary owing to corresponding regulations to monitor the power of the high-voltage accumulator cooling arrangement and possibly to display a fault in the event of an insufficient cooling capacity. Furthermore, provision is made, for example, to automatically ascertain and display the frequency with which a corresponding diagnosis is implemented.

It is customary to execute the monitoring of a cooling system by means of a diagnosis which is matched to the respective cooling technique and which, for its part, requires a corresponding sensor system, this including, for example, cooling liquid temperature sensors and throughflow sensors in the case of a liquid cooling arrangement.

However, the need to use a separately matched diagnosis technique for each cooling technique is inconsistent with the construction kit concept and modularity since a corresponding diagnosis function has to be developed and corresponding measurement equipment has to be provided for each cooling system. Furthermore, dedicated sensors are required for monitoring purposes if necessary, said sensors pushing up the costs of production.

The present invention is therefore based on the object of providing a method for monitoring the functional capability of the cooling system of a high-voltage accumulator which is in operation and also a monitoring apparatus which is suitable for this purpose, where the diagnosis can be performed independently of the cooling technique.

This object is achieved by a method, by a computer program product which implements said method and also by a corresponding monitoring apparatus, according to the claimed invention.

According to the invention, the method for monitoring the functional capability of the cooling system of a high-voltage accumulator which is in operation, in particular a high-voltage accumulator for an electrical drive unit of a motor vehicle, comprises the following steps: the temperature of the high-voltage accumulator is measured by means of a temperature sensor which is arranged on the high-voltage accumulator, wherein a plurality of such measurements are generally performed. In contrast to the procedure outlined at the outset, it is therefore not the temperature of a coolant or the like that is measured, but rather the temperature is measured directly at the high-voltage accumulator itself. Furthermore, a check is made to determine whether the respectively measured temperature value lies above a cooling threshold temperature. The cooling of a high-voltage accumulator is usually not continuous, but rather the cooling system is only switched on when it is required, wherein no diagnosis is required in this case. However, the cooling system is or will be switched on when the temperature of the high-voltage accumulator exceeds a specific threshold value—the cooling threshold temperature. The variation in the temperature of the high-voltage accumulator is then ascertained from the time sequence of those measured temperature values of the high-voltage accumulator that are above the cooling threshold temperature and a diagnosis that the cooling system is operating correctly can be made if the temperature profile does not exceed a predetermined limit value. Different variables, such as a specific temperature gradient over the measurement time, a permissible maximum temperature of the high-voltage accumulator or a temperature value which lies below said maximum temperature and therefore has a certain safety buffer, can be used as the predetermined limit value of the temperature profile.

The abovementioned diagnosis result can then be displayed, for example, on a display in order to indicate to a user (the driver in the case of a motor vehicle) that the high-voltage accumulator is operating correctly. In addition, said diagnosis result can be transmitted to a motor controller, so that said motor controller can furthermore control and/or monitor the vehicle. If the diagnosis result were negative, the motor controller would have the option of throttling or even entirely suppressing the power output of the high-voltage accumulator in order to avoid damage.

Since, according to the invention, the temperature is measured directly at the high-voltage accumulator itself and it is not necessary to employ an "indirect" measurement of the temperature of a coolant or the like, the method according to the invention therefore renders possible diagnosis of the functional capability of the coolant independently of the cooling technique, which diagnosis can moreover be executed in a simple and cost-effective manner since, for the purpose of temperature measurement of the high-voltage accumulator, the temperature sensor which is installed in said high-voltage accumulator in any case can be employed.

According to an advantageous embodiment of the method according to the invention, the temperature gradient is used as a measure of the variation in the temperature, and in this case the predetermined limit value is a maximum temperature gradient. In other words, this means that, under given environmental conditions, such as a specific outside temperature and a present current loading of the high-voltage accumulator for example, a cooling arrangement can be assumed to be fully functional when the maximum temperature gradient is not exceeded.

According to a further advantageous embodiment of the method according to the invention, the power loss which is generated by the operation of the high-voltage accumulator is ascertained, and the higher the power loss, the higher the maximum temperature gradient can be selected to be. In other words, this means that, in the case of a correspondingly powerful cooling system, higher temperature gradients are also permissible since a cooling system of this kind can also dissipate correspondingly occurring quantities of heat.

Since a measured temperature value has exceeded the cooling threshold temperature for the first time during the course of a diagnosis process, it may be advantageous to await a predetermined first time period $T_{act}$ until the next temperature measurement and then ascertain the temperature gradient for a predetermined second time period $t_{obs}$. The ratio of heating to sensor accuracy is generally very small and, on account of the high thermal inertia of the high-voltage accumulator system, waiting has the advantage that the diagnosis is more robust.

A further advantageous embodiment of the method according to the invention can involve the energy loss resulting from the power loss, which energy loss has accrued over a predetermined third time period, being aggregated (summed or integrated) and the maximum temperature gradient then being ascertained from a previously ascertained or established characteristic curve of the temperature gradient with respect to the energy loss. This has the advantage that the maximum temperature gradient does not need to be permanently prespecified, but rather is variable over a specific value range and therefore matching to different operating situations or different types of high-voltage accumulators is possible. In this case, said third time period can be as large as the abovementioned second time period.

In the method according to the invention, it is advantageous when the maximum temperature gradient lies between 0.1 K/min and 1.5 K/min, preferably between 0.25 K/min and 1.0 K/min, and in particular between 0.5 K/min and 0.75 K/min.

In the method according to the invention, it is also advantageous when the cooling threshold temperature lies between 25° C. and 35° C., preferably between 27° C. and 32° C., and in particular between 29° C. and 31° C.

According to a further advantageous embodiment of the method according to the invention, the diagnosis result is additionally first passed on to the electronic controller of the respective cooling system. There, the diagnosis result is checked for plausibility on the basis of the present operating and environmental conditions of the cooling system. If the diagnosis result is rejected on account of plausible boundary conditions, no fault report is made (e.g. when the cooling system is operated beyond the design limits or its own power is reduced, e.g. very high outside temperatures, very high load, discharged battery, . . . ). Furthermore, the diagnosis result from the high-voltage accumulator can be continuously evaluated and checked for plausibility. If a diagnosis result of insufficient cooling is made in a defined manner several times in succession, the diagnosis is nevertheless confirmed by the electronic controller of the cooling system since it is then assumed that there is a fault in spite of extreme boundary conditions. If the diagnosis result is confirmed by the electronic controller of the cooling system, the information can be passed on to the display in the above-described manner for example. This multi-stage diagnosis model of high-voltage accumulator system and cooling system has the advantage that all of the available information is incorporated in the diagnosis and therefore makes the diagnosis more robust and convincing overall.

The present invention includes a computer program product (possibly also split between several electronic control devices in terms of functioning) which, when run on a CPU, executes the method according to the above description, and a monitoring apparatus of corresponding design for monitoring the functional capability of the cooling system of a high-voltage accumulator which is in operation, in particular of a high-voltage accumulator for an electrical drive unit of a motor vehicle, wherein the monitoring apparatus is configured and designed such that it executes the method according to the above description.

The present invention also includes a motor vehicle comprising an electrical drive unit and a high-voltage accumulator which is provided for it, wherein the motor vehicle comprises the abovementioned monitoring apparatus.

Accordingly, the same or similar advantages are also produced as those in connection with the above description, for which reason reference is made to the above statements in connection with the method according to the invention in order to avoid repetitions.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
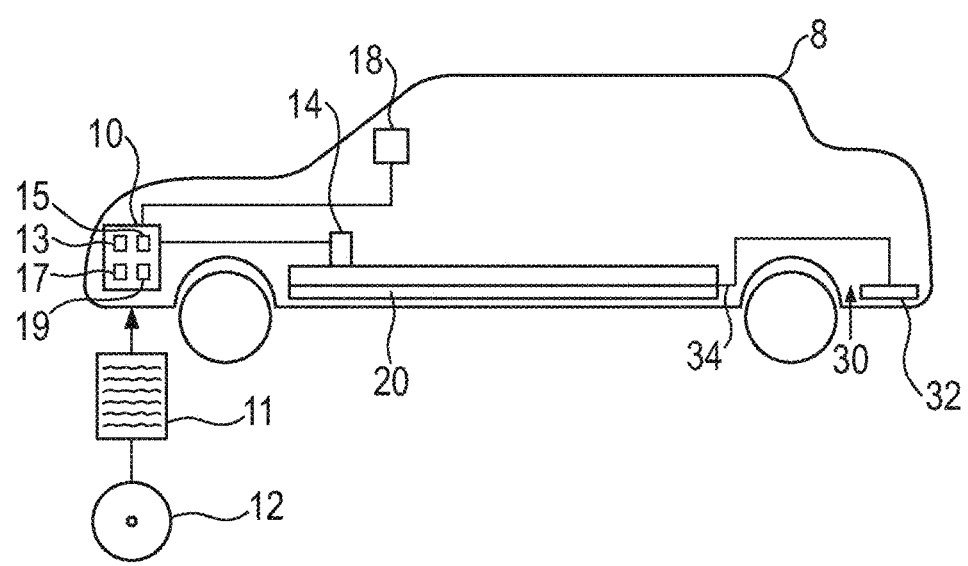
FIG. 1 is a schematic illustration of a motor vehicle comprising a high-voltage accumulator and a monitoring apparatus.

FIG. 1 schematically illustrates a motor vehicle 8, in which motor vehicle a high-voltage accumulator 20 is provided with a monitoring apparatus 10. In this case, the high-voltage accumulator 20 is provided, for example, in the central region of the motor vehicle 8 between the two vehicle axles. A cooling system 30 comprising a pump 32 and a cooling line 34 is provided for cooling the high-voltage accumulator 20. A temperature sensor 14 for measuring the temperature of the high-voltage accumulator 20, which temperature sensor supplies its measurement information to a monitoring apparatus 10 which is provided in the engine compartment of the motor vehicle 8 for example, is provided directly on or even in the high-voltage accumulator 20. The monitoring apparatus 10 is connected to a display 18 which, in this example, is arranged in the field of view of the driver of the motor vehicle 8 and on which, for example, the diagnosis result of the monitoring apparatus 10 can be displayed. Reference numeral 11 schematically denotes a computer program or a computer program product which implements the method according to the invention and can be stored, for example, on a data carrier 12 (illustrated as a CD-ROM here).

Figure 2:
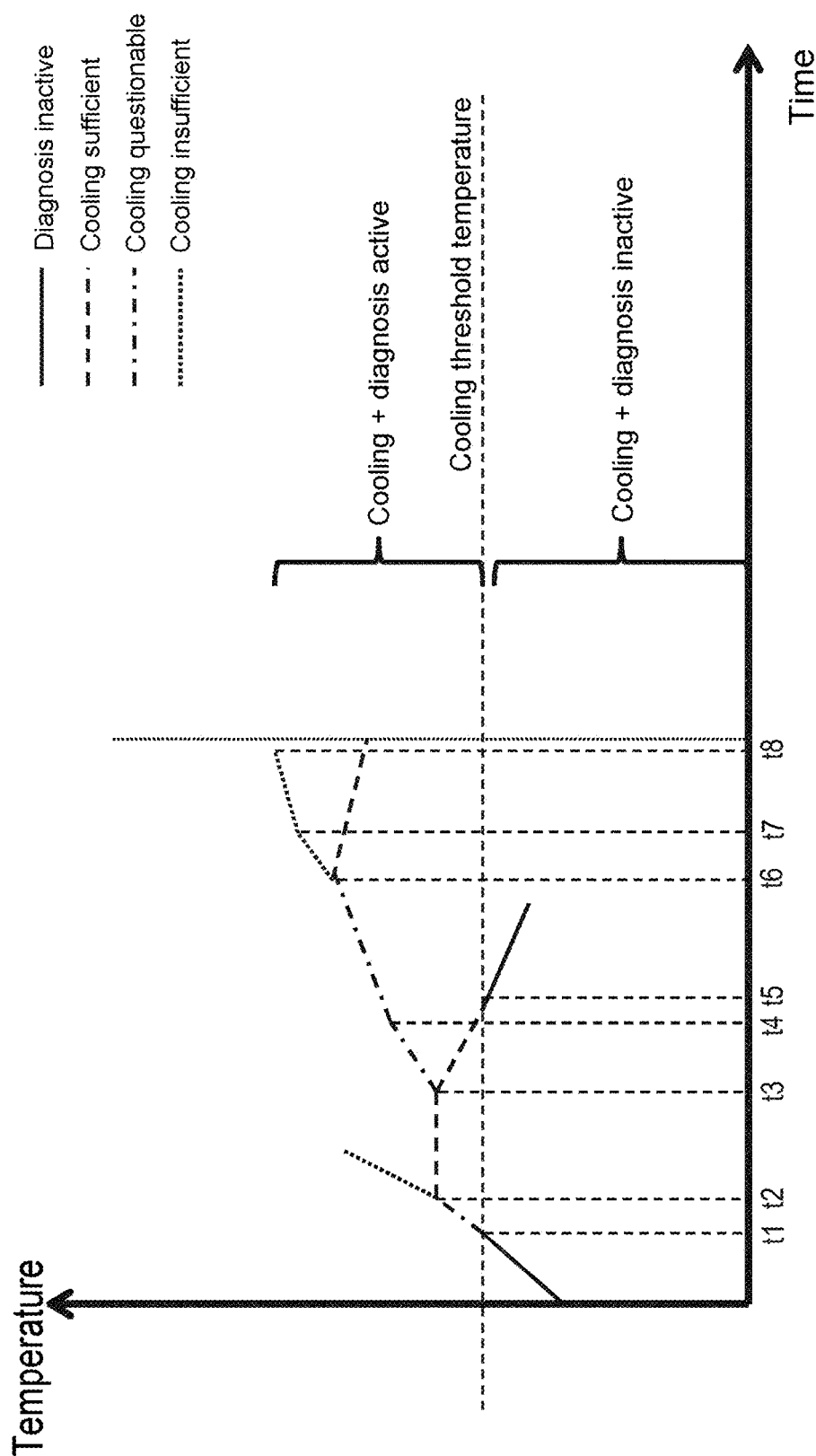
FIG. 2 is a schematic illustration of examples of different operating sequences.

In FIG. 2, the temperature which is measured directly at the or in the high-voltage accumulator 20 is plotted with respect to time in a graph, and a plurality of different possible temperature profiles are illustrated. A dashed horizontal line indicates the cooling threshold temperature which is 30° C. for example, wherein both cooling and also diagnosis are active or switched on above said cooling threshold temperature, whereas cooling and diagnosis are inactive or switched off below the cooling threshold temperature.

If, for example, the high-voltage accumulator 20 is switched on at time t=0 and—proceeding from a temperature below the cooling threshold temperature—slowly heats up with a specific temperature gradient (which, as is known, corresponds to the gradient of the curve in this graph), the cooling and the diagnosis remain switched off until the cooling threshold temperature is reached. Therefore, only the self-diagnosis of the cooling system is active below the cooling threshold of the high-voltage accumulator. After the cooling threshold temperature is exceeded at time t1, both the cooling by the cooling system 30 and also the diagnosis by the monitoring apparatus 10 are switched on, and, in the case of the given temperature gradient (illustrated using a dashed and dotted line) it is initially questionable during a specific time period whether the cooling is operating correctly.

If the temperature gradient rises yet further starting from time t2 (corresponding to the dotted line), the monitoring apparatus 10 diagnoses that the cooling is not operating correctly and outputs a corresponding report initially to the monitoring apparatus of the cooling system and then a corresponding report to the display 18.

If, however, the temperature gradient drops sharply and, according to this example, actually merges with a horizontal line (corresponding to the dashed line) starting from time t2, this corresponding to the achieved temperature being maintained, the monitoring apparatus 20 diagnoses that the cooling is operating correctly. If the temperature gradient actually becomes negative and therefore the temperature drops at time t3, the diagnosis that the cooling is operating correctly does not change. If the temperature then actually falls below the cooling threshold temperature at time t5, both the cooling and also the diagnosis are switched off again since they are not required (any longer).

However, the situation may also occur, for example, that the temperature gradient increases again starting from time t3 (therefore once again a dashed and dotted line) and drops again starting from time t4, but is still positive. In this case, the monitoring apparatus 10 continues to monitor the temperature gradient and diagnoses that the cooling is questionable. If the temperature gradient again increases at time t6 and possibly once again at time t7 (therefore the temperature gradient is again illustrated by a dotted line starting from time t6), the monitoring apparatus 10 can actually still tolerate this in this example because it can assume that, although the cooling is insufficient or at least not completely sufficient, a critical temperature value which would jeopardize the operational reliability or even the integrity of the high-voltage accumulator 20 has not yet been reached. However, this diagnosis result can be displayed, for example, on the display 18 in order to correspondingly inform the driver. If both a specific temperature gradient and also a permissible maximum value of the temperature were to be reached at a time t8 in spite of all preventative measures, the monitoring apparatus 10 diagnoses failure of the cooling (and shifts, for example, the drive down to a minimum or even switches it off completely in order to prevent damage to the high-voltage accumulator 20).

If, however, the temperature gradient becomes negative again at time t6 (for which reason the temperature profile is then illustrated using a dashed line again), the monitoring apparatus 10 concludes that the cooling system 30 is operating correctly or sufficiently and possibly indicates this on the display 18.

Figure 3:
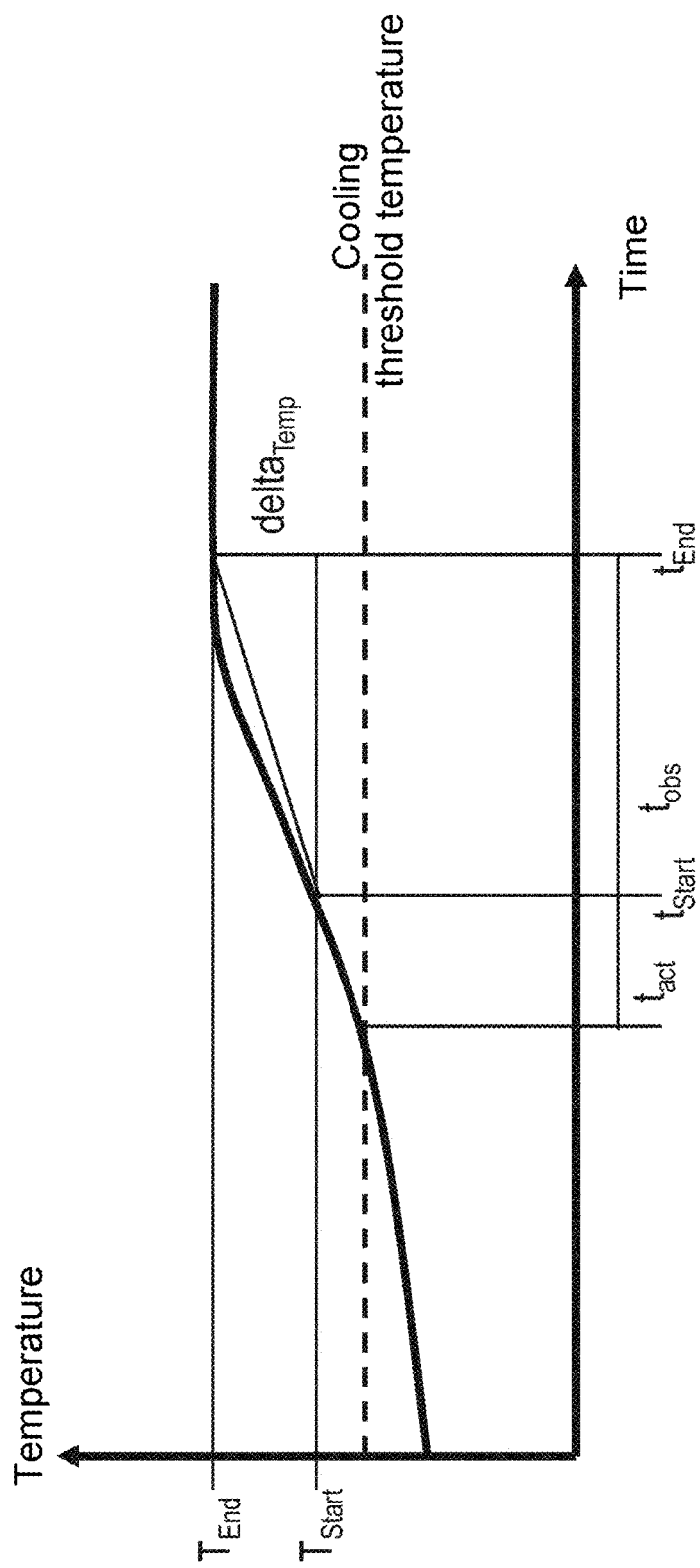
FIG. 3 is a schematic illustration of an example of ascertaining the temperature gradient.

FIG. 3 illustrates, by way of example, how the monitoring apparatus 10 proceeds in order to ascertain the temperature gradient. When the temperature has reached or exceeded the cooling threshold temperature, the process of ascertaining the temperature gradient is not started immediately, but rather a time period $t_{act}$ is initially awaited for the purpose of stabilizing the cooling system (and the temperature gradient is ascertained only thereafter for a time period $t_{obs}$ by way of the temperature difference $delta_{Temp}$ between the temperature end at the end and the temperature $T_{Start}$ at the start of the time period $t_{obs}$ being divided by the elapsed time $t_{obs}$.

Figure 4:
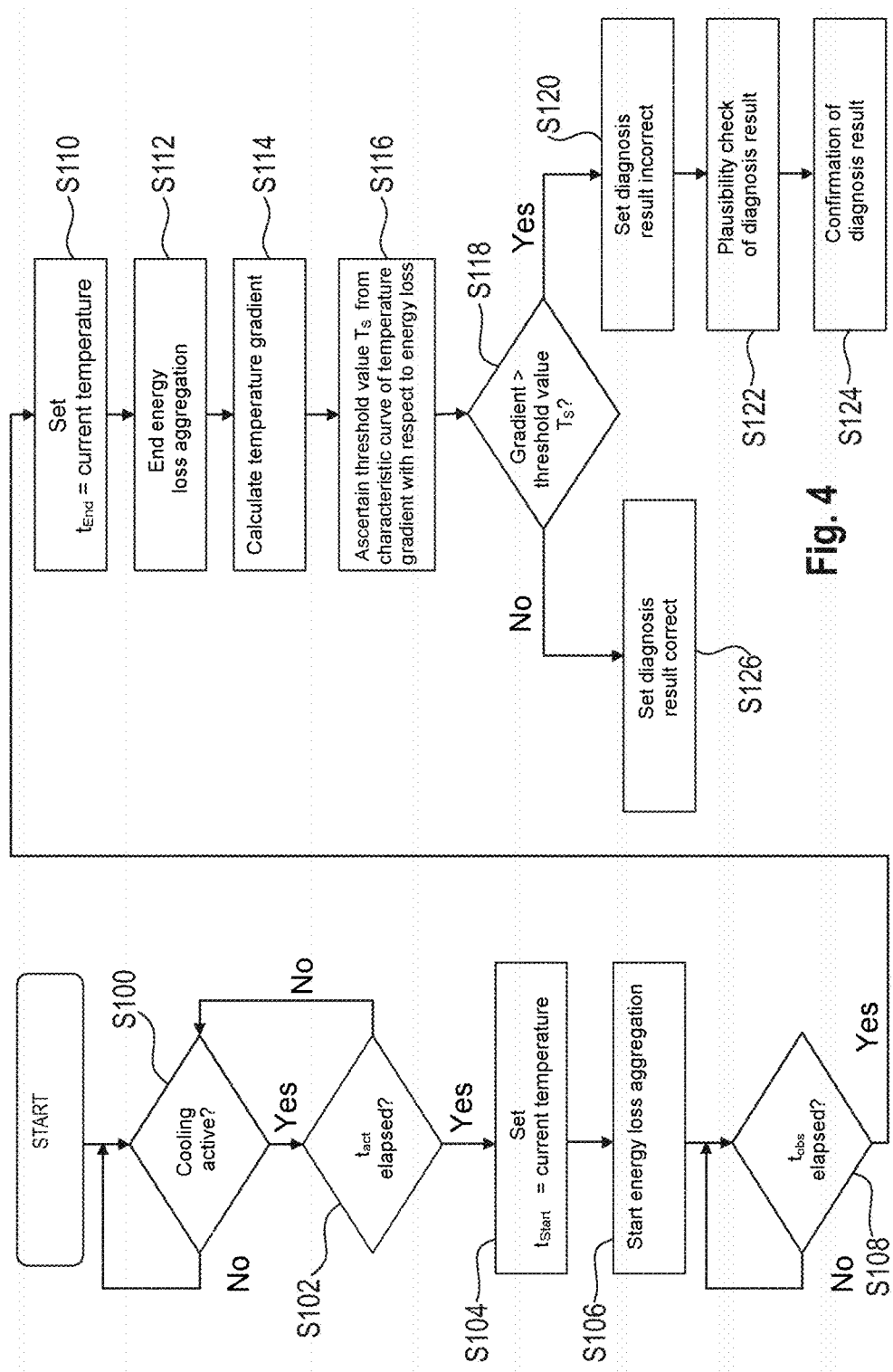
FIG. 4 is a flowchart of the diagnosis process.
Figure 5:
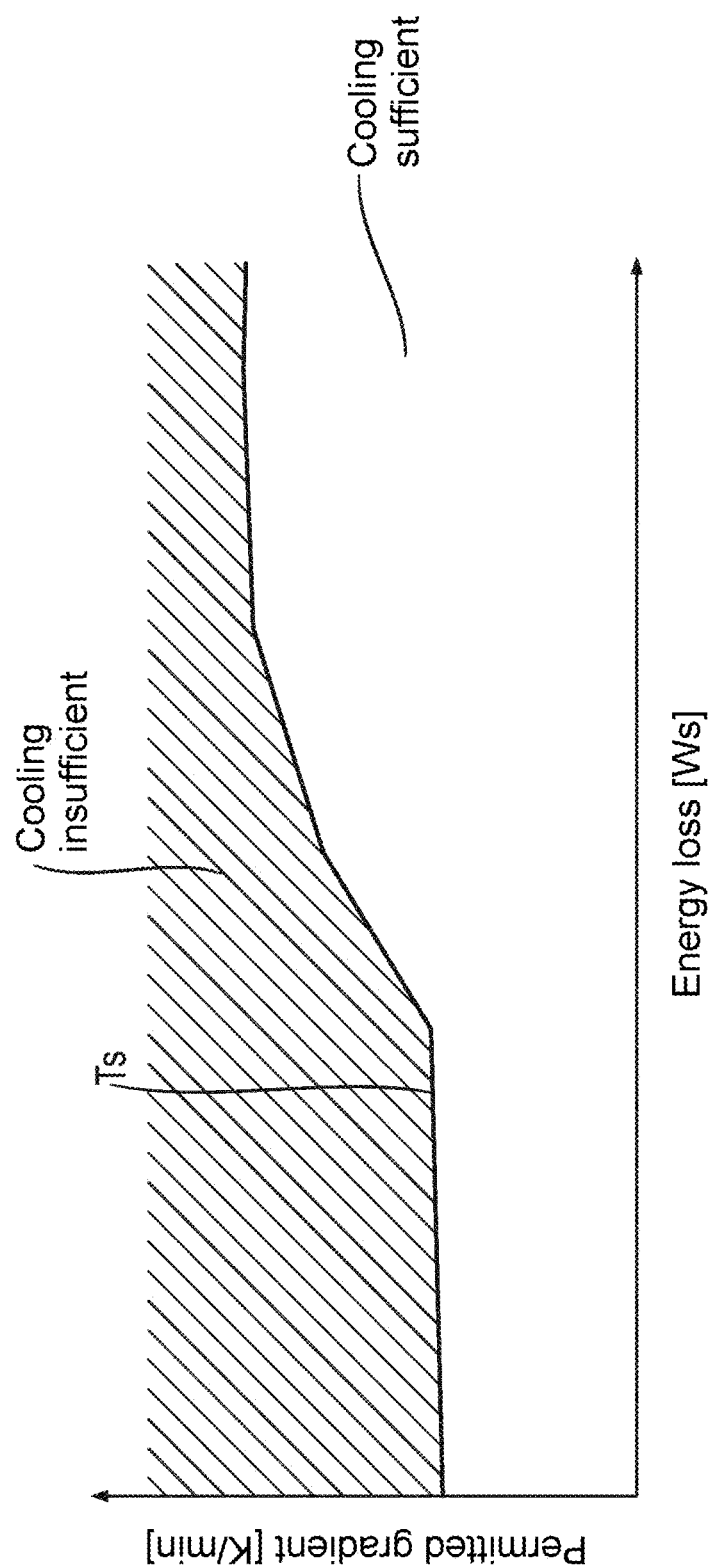
FIG. 5 is an exemplary characteristic curve of the variation in the permitted temperature gradient depending on the energy loss of the high-voltage accumulator.

FIG. 4 shows an exemplary course of the monitoring method according to the invention. After the start of the monitoring method, a check is made in step S100 to determine whether the cooling is active. If this is the case, a check is made in step S102 to determine whether the time period $t_{act}$ (has elapsed. If this is not the case, the sequence returns to step S100. However, if the time period $t_{act}$ has already elapsed, the current temperature at this time $t_{Start}$ is selected as start temperature $T_{Start}$ in step S104. Then, aggregation of the accrued energy loss is started in step S106. A check is made in a subsequent step S108 to determine whether the time period $t_{obs}$ has elapsed. If this is not the case, this is awaited, otherwise the current temperature $T_{End}$ at this time $t_{End}$ is then selected as the end temperature in step S110. The aggregation of the energy loss is then ended in step S112, after which the temperature gradient is calculated in step S114. Finally, a threshold value $T_S$ for the corresponding temperature range and the associated maximum temperature gradient is ascertained from the characteristic curve of the temperature gradient over the aggregated energy loss in step S116. FIG. 5 illustrates a characteristic curve of this kind of the threshold value $T_S$ of the temperature gradient with respect to the aggregated energy loss. If the temperature gradient is above the line of the threshold value $T_S$ (that is to say in the hatched region), the cooling is considered to be insufficient, whereas the cooling is assumed to be sufficient if the temperature gradient is below the line of the threshold value $T_S$. (In the subsequent step S118, this temperature gradient is compared with the threshold value $T_S$, and if the temperature gradient is greater than the threshold value $T_S$, the diagnosis result established in step S120 is that the cooling is not operating correctly, denoted there as "Diagnosis result incorrect". The diagnosis result incorrect is then checked for plausibility in the monitoring device of the cooling system in step S122. Given plausible boundary conditions, the diagnosis result incorrect is declared valid in step S124. If, however, the temperature gradient is smaller than the threshold value $T_S$, the diagnosis result established in step S126 is that the cooling is functioning correctly, which is denoted there as "Diagnosis result correct".

The above description in respect of the diagnosis relates predominantly to the maximum temperature gradient and not so much to the temperature range of the high-voltage accumulator 20 in which said maximum temperature gradient occurs. The respective temperature range can be taken into account in the following way: at relatively high temperatures of the high-voltage accumulator, the power of the high-voltage accumulator may be limited, this leading to a smaller input of thermal energy and corresponding heating. Therefore, it may be expedient to permit a lower maximum temperature gradient at relatively high temperatures of the high-voltage accumulator than is the case at relatively low temperatures of the high-voltage accumulator.

It goes without saying that in the present invention there is a relationship between firstly features which have been described in connection with method steps and also secondly features which have been described in connection with corresponding apparatuses. Therefore, described method features are also to be considered to be apparatus features which belong to the invention—and vice versa—even if this has not been explicitly stated.

It should be noted that the features of the invention described with reference to individual embodiments or variants, such as for example type and configuration of the individual method steps and the time sequence thereof, can also be present in other embodiments, unless stated otherwise or automatically ruled out for technical reasons. In addition, all features of features of this kind, described in combination, of individual embodiments do not necessarily always have to be realized in a respective embodiment.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for monitoring functional capability of a cooling system of a high-voltage accumulator which is in operation, the method comprising the steps of:
   repeatedly measuring a temperature of the high-voltage accumulator by way of a temperature sensor which is arranged on the high-voltage accumulator;
   checking whether the respectively measured temperature value is above a cooling threshold temperature;
   determining a profile of the temperature of the high-voltage accumulator from a temporal sequence of those measured temperature values of the high-voltage accumulator that are above the cooling threshold temperature; and
   diagnosing that the cooling system is operating correctly if a temperature gradient of the temperature profile does not exceed a maximum temperature gradient, wherein the temperature gradient serves as a measure of variation in the temperature,
   wherein a power loss which is generated by operation of the high-voltage accumulator is ascertained, and wherein a higher maximum temperature gradient is used the higher the power loss.

2. The method according to claim 1, wherein
   as soon as a first measured temperature value has exceeded the cooling threshold temperature, a predetermined first time period until the next temperature measurement is awaited and then the temperature gradient is ascertained for a predetermined second time period.

3. The method according to claim 1, wherein
   energy loss resulting from the power loss, which energy loss has accrued over a predetermined third time period, is aggregated and the maximum temperature gradient is ascertained from a characteristic curve of the temperature gradient with respect to the energy loss.

4. The method according to claim 1, wherein
   the maximum temperature gradient lies between 0.1 K/min and 1.5 K/min, and/or
   the cooling threshold temperature lies between 25° C. and 35° C.

5. The method according to claim 1, wherein
   the maximum temperature gradient lies between 0.25 K/min and 1.0 K/min, and/or
   the cooling threshold temperature lies between 27° C. and 32° C.

6. The method according to claim 1, wherein
   the maximum temperature gradient lies between 0.5 K/min and 0.75 K/min, and/or
   the cooling threshold temperature lies between 29° C. and 31° C.

7. The method according to claim 1, wherein
   if a result of the diagnosis of the functional capability of the cooling system is that the cooling system is not operating correctly, said result of the diagnosis is checked for plausibility in a monitoring device of the cooling system.

8. A computer product comprising a non-transitory computer readable medium having stored thereon program code that, when executed on a processor, carries out the acts of:
   repeatedly measuring a temperature of the high-voltage accumulator by way of a temperature sensor which is arranged on the high-voltage accumulator;
   checking whether the respectively measured temperature value is above a cooling threshold temperature;
   determining a profile of the temperature of the high-voltage accumulator from a temporal sequence of those measured temperature values of the high-voltage accumulator that are above the cooling threshold temperature; and
   diagnosing that the cooling system is operating correctly if a temperature gradient of the temperature profile does not exceed a maximum temperature gradient, wherein the temperature gradient serves as a measure of variation in the temperature,
   wherein a power loss which is generated by operation of the high-voltage accumulator is ascertained, and wherein a higher maximum temperature gradient is used the higher the power loss.

9. A monitoring apparatus for monitoring functional capability of a cooling system of an operating high-voltage accumulator for a motor vehicle electric drive, wherein the monitoring apparatus is configured to execute a process of:
   repeatedly measuring a temperature of the high-voltage accumulator by way of a temperature sensor which is arranged on the high-voltage accumulator;
   checking whether the respectively measured temperature value is above a cooling threshold temperature;
   determining a profile of the temperature of the high-voltage accumulator from a temporal sequence of those measured temperature values of the high-voltage accumulator that are above the cooling threshold temperature; and
   diagnosing that the cooling system is operating correctly if a temperature gradient of the temperature profile does not exceed a maximum temperature gradient, wherein the temperature gradient serves as a measure of variation in the temperature,
   wherein a power loss which is generated by operation of the high-voltage accumulator is ascertained, and wherein a higher maximum temperature gradient is used the higher the power loss.

10. A motor vehicle, comprising:
    an electrical drive unit;
    a high-voltage accumulator for the electrical drive unit; and
    a monitoring apparatus according to claim 9.

* * * * *